United States Patent [19]
Zarabadi

[11] Patent Number: 5,491,443
[45] Date of Patent: Feb. 13, 1996

[54] VERY LOW-INPUT CAPACITANCE SELF-BIASED CMOS BUFFER AMPLIFIER

[75] Inventor: Seyed R. Zarabadi, Kokomo, Ind.

[73] Assignee: Delco Electronics Corporation, Kokomo, Ind.

[21] Appl. No.: 183,706

[22] Filed: Jan. 21, 1994

[51] Int. Cl.$^6$ ................................................ H03K 17/687
[52] U.S. Cl. .......................... 327/391; 327/437; 327/328
[58] Field of Search ..................................... 327/327, 328, 327/387, 391, 427, 637, 562, 379, 434, 65, 77, 78, 563; 330/257

[56] References Cited

U.S. PATENT DOCUMENTS

| | | | |
|---|---|---|---|
| 4,327,321 | 4/1982 | Suzuki et al. | 323/315 |
| 4,361,797 | 11/1982 | Kojima et al. | 393/316 |
| 4,806,789 | 2/1989 | Sakihama et al. | 307/297 |
| 4,808,848 | 2/1995 | Miller | 307/355 |
| 5,057,701 | 10/1991 | Miller, Jr. | 307/262 |
| 5,182,479 | 1/1993 | Behagel et al. | 307/571 |
| 5,216,291 | 6/1993 | Seevinek et al. | 307/296.6 |

FOREIGN PATENT DOCUMENTS

| | | |
|---|---|---|
| 0355906 | 2/1990 | European Pat. Off. . |
| 2184623 | 6/1987 | United Kingdom . |

OTHER PUBLICATIONS

W. Yun, R. T. Howe and P. R. Gray, "Surface Micromachined, Digitally Force Balanced Accelerometer With Integrated CMOS Detection Circuitry," Tech Digest, Solid State Sensors and Actuators Workshop, Hilton Head, S.C., pp. 126–131, Jun. 1992.

Primary Examiner—Timothy P. Callahan
Assistant Examiner—My-Trang Nu Ton
Attorney, Agent, or Firm—Jimmy L. Funke

[57] ABSTRACT

A low-input capacitance self-biased CMOS buffer amplifier (10) which buffers a low-amplitude capacitively coupled output of a sensor to subsequent output circuitry. The buffer amplifier (10) includes a buffer stage (12) which includes an input FET (16) whose gate terminal is connected to the output of the sensor. In order to eliminate the gate-to-source, gate-to-drain and gate-to-substrate capacitances of the input FET (16), various FETs are associated with the buffer stage (12) are interconnected such that the integrity of the input signal is maintained. An output FET (18) has its source terminal connected to the source terminal of the input FET (16). Additionally, a tail cascoded current source (20, 22) is connected to the source terminals of the input and output FETs (16, 18) such that the gate-to-source voltages of these two FETs (16, 18) is the same. The gate terminal and the drain terminal of the output FET (18) are connected such that the input and output FETs (16, 18) act as unit to gain amplifier. The gate terminal of the output FET (18) is connected to two other FETs (24, 26) which transfer the gate-to-drain voltage of the output FET (18) to the drain terminal of the input FET (16). In order to eliminate the gate-to-substrate capacitance, the gate terminal of the input FET (16) is shielded from the substrate by a bottom metal layer (28) of this FET (16). Several self-biasing features are provided to interconnect the FETs in the circuit such that a common current flow is maintained throughout the buffer stage (12).

35 Claims, 4 Drawing Sheets

VERY LOW-INPUT CAPACITANCE SELF-BIASED CMOS BUFFER AMPLIFIER

BACKGROUND OF THE INVENTION

1. Field Of The Invention

This invention relates generally to a buffer for buffering a capacitively coupled output of a sensor and, more particularly, to a low-input capacitance self-biased CMOS buffer amplifier which buffers a low amplitude capacitively coupled output of a sensor to subsequent output circuitry.

2. Discussion Of The Related Art

For the most part, sensors such as pressure transducers, infrared detectors and the like, provide an AC capacitively coupled output at a very low voltage. That is, the output of these types of sensors are capacitively coupled to subsequent processing circuitry, such as an amplifier, which typically amplifies and processes the output signal to a usable form. Because the output voltages of these sensors are so small, an amplifier which receives the output signal from the sensor may destroy the signal because of poor capacitive coupling between the sensor and the amplifier circuitry. In other words, because the output capacitance of the sensor is small, the transfer of the signal from the sensor to the amplifier circuitry may be overwhelmed by the parasitic input capacitance of the amplifier circuitry. Therefore, it has been known to use buffering circuitry to buffer the output signal before applying it to the amplifier circuitry.

A second concern of coupling the capacitive output of these types of sensors to the amplifying output circuitry is the loss of signal because of DC leakage within the components of the output circuitry. Because the output voltage of the sensors is small, DC leakage occurring in the amplifier circuitry can have a serious effect on the integrity of the signal in that DC leakage will act as a filter that limits the frequency range of the output signal. In order to overcome the effects of DC leakage, it is known to incorporate metal oxide semiconductor field effect transistors (MOSFET) as the basic amplifying components in an output buffer and associated amplifier. In this application, field effect transistors have been known to be very effective in significantly eliminating DC leakage.

The main concern when designing a buffer therefore becomes the parasitic capacitance associated with the input connection to a MOSFET associated with the buffer. Typically, the output signal from the sensor is directly applied to a gate electrode of an input MOSFET. This FET includes a total input capacitance appearing at the gate of the input FET as a sum of its gate-to-source, gate-to-drain, and gate-to-substrate capacitances. Further, since buffers of this type are self powered, a mechanism needs to be included that enables the buffer to be DC biased, but does not introduce a capacitance to the input signal. Therefore, an important concern when designing an output buffer is attempting to eliminate or substantially limit these capacitances in order to maintain the integrity of the output signal.

An article, Yun, W., et al. titled "Surface Micromachined, Digitally Forced-Balanced Accelerometer With Integrated CMOS Detection Circuitry," Tech Digest Solid State Sensors and Actuators Workshop, Hilton Head, S.C., pp. 126–131, June 1992 discloses a unity gain buffer having a low input capacitance for use with an accelerometer circuit. The input buffer of this article uses a diode clamp technique in that a diode having a zero voltage is placed at the gate electrode of an input FET. The zero voltage causes the diode to have an extremely non-linear input voltage-to-diode junction capacitance which results in distortion and signal attenuation as a result of the nonlinear capacitive divider between the sensor and the diode junction capacitor. A unity gain buffer of this type requires several matched devices having a source-to-substrate voltage of the same value. Any of the source-to-substrate voltages, device sizes and DC biasing current which are not matched can potentially cause an oscillation in the buffer device, thus providing a potential drawback.

What is needed then is a buffer for buffering the output of a capacitive coupled sensor in which the buffer includes an effective zero capacitance as seen by the capacitive output of the sensor. It is therefore an object of the present invention to provide such a buffer.

SUMMARY OF THE INVENTION

In accordance with the teaching of the present invention, a self-biasing buffer amplifier is disclosed which buffers the output of any of a number of sensors having a low capacitive output such that the output information of the sensor is maintained when applied to additional output circuitry. The buffer circuit includes a number of various amplifying MOSFETs which are electrically configured such that the gate-to-source, gate-to-drain and gate-to-substrate capacitances of an input FET do not contribute to the capacitance of the device.

In order to eliminate the gate-to-source capacitance, the source terminal of the input FET is connected to a tail cascoded current source. Additionally, the source terminal of an output FET is connected to the source terminal of the input FET and the tail cascoded current source such that the gate-to-source voltages of the input and output FETs are equal. Further, the gate terminal and the drain terminal of the output FET are connected so that the gate voltage of the output FET follows the common source terminal voltage of the input and output FETs. Therefore, the input and output FETs act as a unity gain amplifier such that the output voltage of the buffer at the gate terminal of the output FET follows the input voltage at the gate terminal of the input FET. The gate-to-drain capacitance is eliminated by applying the gate (and drain) voltage of the output FET to the drain terminal of the input FET through two other FETs also acting as a unity gain buffer. The gate-to-substrate capacitance is eliminated by a fabrication layout technique in which the drain terminal of the input FET is connected to the shielding bottom metal layer of the input FET during fabrication such that the dielectric material of the substrate does not create a capacitance between the gate terminal and the substrate. Since the capacitance of the gate-to-the bottom metal sees a common-node voltage across it, its capacitance does not increase the total input capacitance.

The buffer amplifier also includes a self-biasing feature such that a DC biasing voltage which powers the buffer amplifier does not create a nonlinear parasitic capacitance on the input signal during stable operation. A series of FETs are interconnected to provide DC current to the tail cascoded current source when it is powered by the DC bias voltage such that the same current will be flowing throughout the buffer stage of the buffer amplifier. Additionally, the gate and drain terminals of a biasing diode junction MOSFET are connected to the drain terminal of an FET associated with the tail cascoded current source, and the source terminal of the biasing junction diode MOSFET is connected to the gate terminal of the input FET. In other embodiments, the self-biasing feature includes a self-biasing network which is insensitive to process variations. The self-biasing network includes a differential amplifier having four FETs configured as a unity gain amplifier.

Additional objects, advantages, and features of the present invention will become apparent from the following description and appended claims, taken in conjunction with the accompanying drawings.

DETAILED DESCRIPTION OF THE PREFERRED EMBODIMENTS

The following discussion of the preferred embodiments concerning low-input buffer amplifiers is merely exemplary in nature and is in no way intended to limit the invention or its application or uses.

Figure 1:
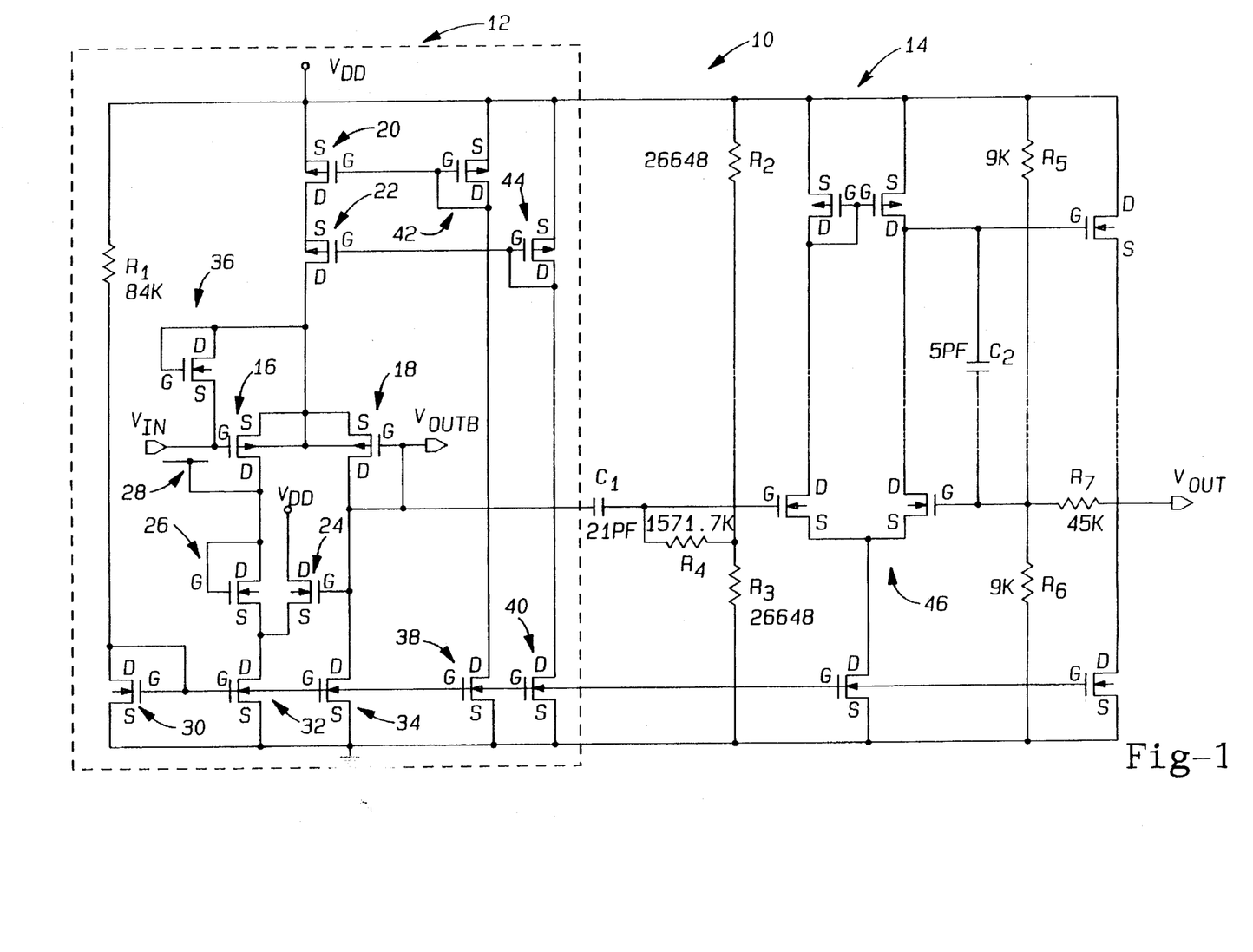
FIG. 1 is a self-biased low-input capacitance buffer amplifier according to one preferred embodiment of the present invention.

FIG. 1 shows a schematic diagram of a buffer amplifier 10 according to one preferred embodiment of the present invention. The buffer amplifier 10 receives a very low AC capacitive output signal from a sensor (not shown), and amplifies this signal to an appropriate level to be processed by subsequent output circuitry (not shown). The buffer amplifier 10 is separated into a buffer stage 12 and an amplifier stage 14. The buffer stage 12 receives an output from the sensor as its input signal $V_{IN}$. The amplifier stage 14 receives an output signal $V_{OUTB}$ from the buffer stage 12 and provides an amplified output signal $V_{OUT}$ as an amplified version of $V_{IN}$. The buffer stage 12 is designed to be capacitively coupled to the sensor without presenting a parasitic capacitance to the input signal which would degrade the sensor performance. Additionally, the buffer stage 12 includes a self-biasing feature which powers the buffer amplifier 10, but also does not add a parasitic capacitance to the input signal $V_{IN}$.

The buffer amplifier 10 includes various MOSFETs which eliminate DC leakage and take advantage of other CMOS features in a manner well understood in the art. The specific MOSFET devices applicable to be used in the buffer amplifier 10 for any of a number of applications would be apparent to one skilled in the art. Each MOSFET has a drain terminal, a source terminal and a gate terminal labeled D, S and G, accordingly. The function and operation of these terminals would also be well understood to anyone skilled in the art. A fourth terminal associated with each MOSFET is a bulk substrate contact positioned between the drain and source terminals. The direction of the arrow of the bulk contact signifies whether the MOSFET is an N-channel or a P-channel MOSFET. An inwardly pointing arrow signifies a N-channel MOSFET and an outwardly pointing arrow signifies an P-channel MOSFET.

A P-channel MOSFET 16 receives the input signal $V_{IN}$ from the sensor at its gate terminal. A P-channel MOSFET 18 provides the output signal $V_{OUTB}$ at its gate terminal. The FET 16 has a total input capacitance as seen by the sensor as the summation of its gate-to-source, gate-to-drain, and gate-to-substrate capacitances caused by the voltage variances across these junctions. These parasitic capacitances need to be eliminated so that the output capacitance of the sensor does not see them, in order to maintain the integrity of the input signal $V_{IN}$ as $V_{OUTB}$.

In order to eliminate the gate-to-source capacitance of the FET 16, the FET 18 is provided as a mirror of the FET 16 in that the source terminals and the bulk substrate contacts of the FETs 16 and 18 are connected. The source terminals of the FETs 16 and 18 are driven by a common current source having a large output swing capability and a very large output impedance, as will be discussed below. In this configuration, the same current flows through the FETs 16 and 18 such that the gate-to-source voltages of the FETs 16 and 18 will be equal during stable operation. Further, the gate terminal and the drain terminal of the FET 18 are connected so that the gate voltage of the FET 18 follows the common source terminal voltage of the FETs 16 and 18. Because of this configuration, the FETs 16 and 18 act as a unity gain amplifier in that $V_{OUTB}/V_{IN}= 1$. Therefore, the voltage $V_{OUTB}$ follows the gate terminal voltage $V_{IN}$ of the FET 16.

The common current source that drives the source terminals of FETs 16 and 18 is a tail cascoded current source consisting of a P-channel MOSFET 20 and a P-channel MOSFET 22. A DC biasing voltage source $V_{DD}$ is applied to the source terminal of the FET 20. The drain terminal of the FET 20 is connected to the source terminal of the FET 22. The drain of the FET 22 is then connected to the source terminals of the FETs 16 and 18 in order to provide the driving potential to these FETs. Each of the source terminals of the FETs 20 and 22 are connected to their substrate terminals. By connecting the gate terminal of the FET 18 to its drain terminal, the common source terminal voltage applied to the FETs 16 and 18 as provided by the current source of the FETs 20 and 22, precisely follows the gate terminal voltage of the FET 16. Therefore, in this configuration, the gate-to-source capacitance of the FET 16 does not contribute to the total input capacitance of the buffer amplifier 10.

The gate-to-drain capacitance is also eliminated by the fact that the FETs 16 and 18 act as a unity gain amplifier. More particularly, the voltage $V_{OUTB}$ at the gate and drain terminal of the FET 18 is sensed by the gate terminal of an N-channel MOSFET 24. The drain terminal of the FET 24 is connected to the source voltage $V_{DD}$ and the source terminal of the FET 24 is connected to the source terminal of an N-channel MOSFET 26. The gate and drain terminals of the FET 26 are connected to the drain terminal of the input FET 16. In this configuration, the FETs 24 and 26 also act as a unity gain amplifier in that the voltage at the gate terminal of the FET 26 follows the voltage at the gate terminal of the FET 24, i.e. $V_{OUTB}$. The voltage $V_{OUTB}$, as sensed by the FET 24, is therefore transferred to the drain of the FET 16. This ensures that the drain terminal voltage of the FET 16 follows the gate terminal voltage of the FET 16. Since the gate-to-drain voltages of the FETs 16 and 18 are the same, this eliminates the gate-to-drain capacitance contribution to the total input capacitance. It is noted that the source terminals of the FETs 24 and 26 are not at the same potential as their substrate potential. This is important to maintain stability of the buffer stage 12.

The gate-to-substrate capacitance is eliminated by a fabrication layout technique. More particularly, a shielding layer, as represented by a contact layer 28, is connected to the drain terminal of the FET 16 in order to isolate the gate terminal of the FET 16 from the substrate. This also is important for the stability of the buffer stage 12. During the fabrication process of the buffer amplifier 10, top and bottom metal layers are patterned as connections to the FET 16, as is well understood in the art. By connecting the drain terminal of the FET 16 to the bottom metal layer and connecting the gate terminal of the FET 16 to the top metal layer, the gate of the FET 16 is shielded from the substrate. Since the potential of the shielding layer 28 is the same as that of the drain terminal of the FET 16, the gate-to-substrate capacitance no longer contributes to the total input capacitance. The shielding layer 28 does not have to be the bottom metal layer. Other equally effective choices for the shielding layer 28 include N-wells, polysilicon layers, etc.

The buffer stage 12 also includes a self-biasing feature. Since the buffer amplifier 10 is capacitively coupled to the sensor by an AC signal, it is necessary to provide a DC bias ($V_{DD}$) in order to properly power the buffer amplifier 10. Accordingly, it is necessary to eliminate any nonlinear parasitic capacitance which may occur as a result of connecting the DC bias source once the buffer amplifier 10 has reached stability. Upon application of the power supply voltage $V_{DD}$, a current is applied to the drain terminal of an N-channel MOSFET 30 through a resistor $R_1$. This current is also applied to the gates of a pair of N-channel MOSFETs 32 and 34 because the drain and gate terminals of the FET 30 are connected, and the gate terminals of the FET 30, the FET 32 and the FET 34 are all connected. Each of the source terminals of the FETs 30, 32 and 34 are connected to ground. Also, the drain terminal of the FET 32 is connected to the source terminal of the FET 26 and the drain terminal of the FET 34 is connected to the gate terminal of the FET 24. Further, the current applied to the FETs 30, 32, and 34 is also being applied to the tail cascoded current source of the FETs 20 and 22 as discussed above.

If the FETs 20 and 22 are operating in their linear region, the drain potentials of the FETs 20 and 22 would be approximately $V_{DD}$. Further, if the FETs 16 and 18 are also operating in their linear region, then the FETs 32 and 34 will be operating in their saturation region. Therefore, by connecting the FETs as discussed in this manner, the same currents that are flowing in the FETs 32 and 34 must also flow in the FETs 16 and 18.

The drain and gate terminals of a biasing diode junction N-channel MOSFET 36 is connected to the drain terminal of the FET 22 and the source terminal of the FET 36 is connected to the gate terminal of the FET 16. At start up, the source terminal voltage of the FET 36 and the gate terminal voltage of the FET 16 are at a substrate potential. Further, the large gate-to-source voltage of the FET 36 requires that a large current flow through this FET. This current must also flow in the FETs 20 and 22 in this configuration. This forces the drain terminal voltage of the FET 22 to a voltage which makes the FETs 20 and 22, and 16 and 18 operate in a saturation region. When the input at the gate terminal of the FET 16 increases, the current flow in the FET 18 also increases, as discussed above, which forces the drain terminal voltage of the FET 18 to decrease and the current flow in the FET 26 to increase. This causes the common source terminal voltages of the FETs 16 and 18 to increase, thus keeping the gate-to-source voltage of the FET 36 at a voltage that is smaller than its threshold voltage. This assures that the FET 16 is on and that it is conducting only a very small leakage current. At this point, the current flow, the gate-to-source voltages, and the drain terminal voltages of the FETs 16 and 18 are equal. Regardless of the initial starting voltages and currents in the devices, the buffer stage 12 will recover from these values and stabilize to identical values which are governed by the mirrored currents as just discussed.

A pair of N-channel MOSFETS 38 and 40 are provided for passing current. Because the gate terminals of the FETs 38 and 40 are connected to the gate terminal of the FET 34, and because the source terminals of the FETs 38 and 40 are connected to ground, the gate-to-source voltage of each of the FETs 38 and 40 is the same as the gate-to-source voltages of the FETs 30, 32 and 34, and thus each of these FETs will also have the same current flowing through them.

The drain terminal of the FET 38 is connected to the drain terminal and the gate terminal of a P-channel MOSFET 42. Also, the drain terminal of the FET 40 is connected to the drain terminal and the gate terminal of a P-channel MOSFET 44. Further, the gate terminal of the FET 42 is connected to the gate terminal of the FET 20, and the gate terminal of the FET 44 is connected to the gate terminal of the FET 22. Such a configuration transfers the common current traveling through the FETs 38 and 40 to the gate terminals of the FETs 20 and 22. By making the device size of the FET 44 one-quarter of the devices sizes of the FETs 20, 22 and 42, a maximum voltage swing at the drain terminal of the FET 22 as applied to the source terminals of the FETs 16 and 18 is achieved. The amplifier stage 14 will now be described. The amplifier stage 14 is a traditional AC coupled, fixed gain amplifier well known in the art, and therefore this description will be merely cursory. An interested reader can readily locate a more detailed discussion of the operation of an amplifier of this type. The output $V_{OUTB}$ at the gate terminal of the FET 18 is applied to a capacitor $C_1$ in the amplifying stage 14. Because the DC component of the AC output voltage $V_{OUTB}$ at the input of the amplifying stage 14 at capacitor $C_1$ will not be known, it is necessary to block this DC value from entering the amplifying stage 14 and set an optimum DC bias voltage. The configuration of the resistors $R_2$, $R_3$ and $R_4$, as shown, provide such a function. Therefore, only a known DC bias voltage $V_{DD}$ is applied to the amplifying stage 14. An amplifying portion 46, consisting of four N and P-channel MOSFETS connected as shown, provides the actual amplification of the output signal $V_{OUTB}$. The gain of the amplifying portion 46 is determined by the resistors $R_5$, $R_6$ and $R_7$ and a capacitor $C_2$. The values given for the different components in the amplifying stage 14 provides a DC gain of approximately 10. It should be understood that other amplifiers could be used in association with the buffer stage 12 discussed above without departing from the spirit and scope of the invention.

Figure 2:
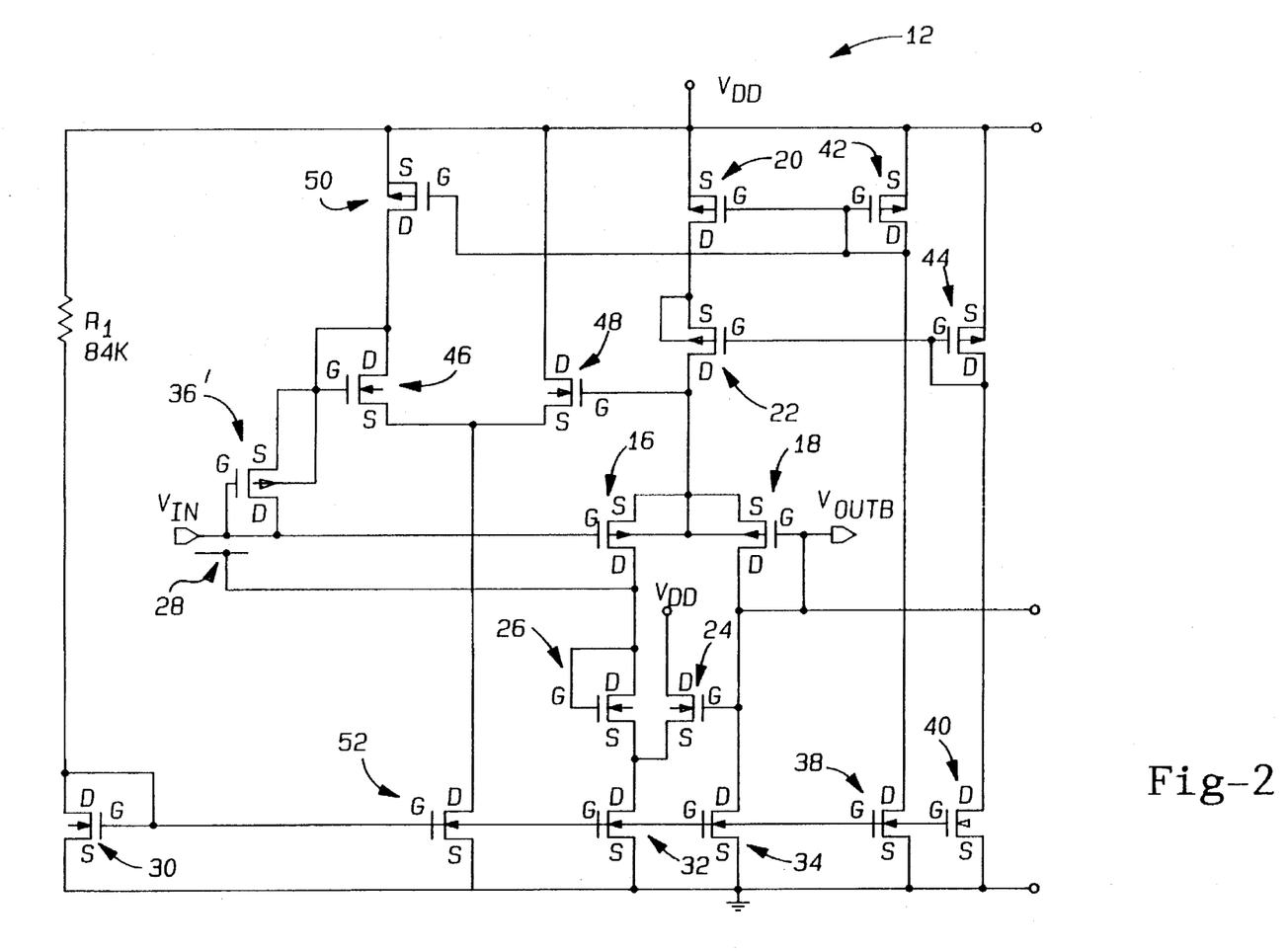
FIG. 2 is a self-biased low-input capacitance buffer amplifier according to another preferred embodiment of the present invention.

Now turning to FIG. 2, a practical embodiment of the invention is shown for providing self-biasing which is insensitive to process variations. What is meant by processing variations are random errors resulting in the fabrication process of the buffer amplifier 10 due to such things as channel length modulation, threshold voltage, device matching and size, body effect, and oxide thickness variations. The embodiment of FIG. 2 is substantially the same as the embodiment of FIG. 1, and as such includes all of the different FETs connected and labeled in the same manner as discussed above. The amplifier stage 14 is not shown since it would be identical to that of FIG. 1, above. However, just as with the embodiment of FIG. 1, other amplifiers could be used. It is noted that the FET 36 is a P-channel MOSFET designated as 36 in this embodiment.

The embodiment of FIG. 2 further includes a differential amplifier configured as a unity gain amplifier. Specifically, an N-channel MOSFET 46 includes a gate and source terminal connected to the drain terminal of the FET 36. Further, an N-channel MOSFET 48 includes a source terminal connected to the source terminal of the FET 46, a gate terminal connected to the source terminals of the FETs 16 and 18, and a drain terminal connected to the voltage supply $V_{DD}$. Additionally, a P-channel MOSFET 50 includes a gate terminal connected to the gate and drain terminals of the FET 42, and a source terminal connected to the voltage supply $V_{DD}$. An N-channel MOSFET 52 includes a gate terminal connected to the gate terminals of the FETs 30 and 32, a drain terminal connected to the source terminals of the FETs 46 and 48, and a source terminal connected to ground.

The connection of the FETs 46-52 as just discussed acts as a unity gain amplifier by creating a short circuit between the gate and drain terminals of the FET 46 in order to provide level shifting and current scaling. The FET 36 appropriately biases the gate terminal of the input FET 16. For proper operation, it is essential to choose the device sizes of the FETs 36, 46, and 48 such that the source-to-gate voltage of the FET 36 forces a very small current to flow in this FET. Note that this small current conduction requirement in the FET 36 can be achieved by choosing a very large device ratio between the FETs 16 and 36. This large device ratio, however, increases the input capacitance. This self-biasing scheme assures low input capacitance and proper biasing for the buffer stage 12.

Figure 3:
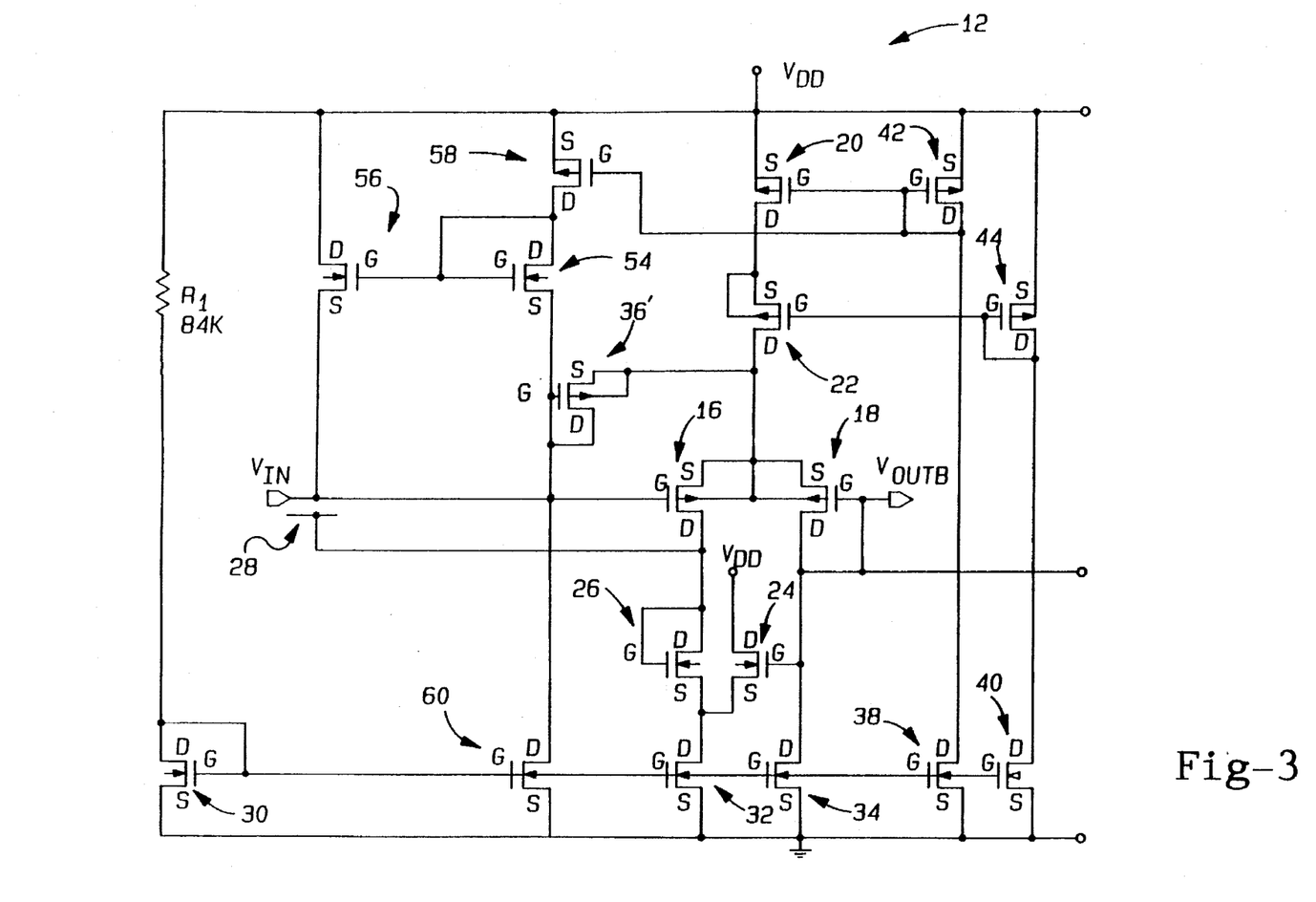
FIG. 3 is a self-biased low-input capacitance buffer amplifier according to another preferred embodiment of the present invention.

FIG. 3 shows another practical embodiment for providing the self-biasing that is also insensitive to the process variation. As with FIG. 2, the buffer stage 12 of FIG. 3 includes all of the different FETs of FIG. 1, and is accordingly labeled by the same reference numerals. The amplifier stage 14 is again not shown in this embodiment since it would be identical to FIG. 1, above. The P-channel MOSFET 36 is also used in this embodiment.

The buffer stage 12 of FIG. 3 includes the voltage level shifting FET 36 that cancels the process variations of the input FET 16. A second self-biasing network consisting of a series of four FETs copies a fraction of the gate and drain voltages of the FET 36 onto the gate terminal of the input FET 16. An N-channel MOSFET 54 includes a source terminal connected to the drain terminal of the FET 36. An N-channel MOSFET 56 includes a gate terminal connected to the gate terminal of the FET 54, a source terminal connected to the gate terminal of the input FET 16, and a drain terminal connected to the voltage supply $V_{DD}$. An N-channel MOSFET 58 includes a drain terminal connected to the drain and gate terminals of the FET 54, a gate terminal connected to the gate and drain terminals of the FET 42, and a source terminal connected to the voltage supply $V_{DD}$. Additionally, an N-channel MOSFET 60 includes a gate terminal connected to the gate terminals of the FETs 30 and 32, a drain terminal connected to the drain terminal of the FET 36 and a source terminal connected to ground. Just as with the embodiment of FIG. 2, it is essential to choose the device sizes of the FET 36, 54 and 56 such that the source-to-gate voltage of the FET 54 will force a very small current to flow in the FET 54. The self-biasing scheme in this embodiment assures low input capacitance and proper biasing for the buffer stage 12.

Figure 4:
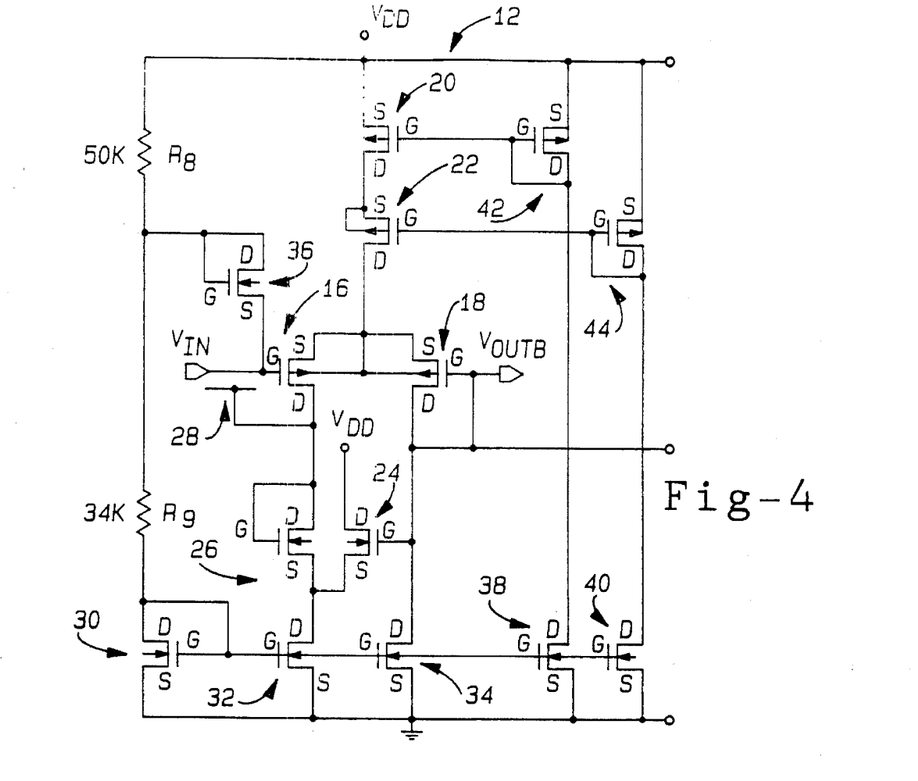
FIG. 4 is a fixed-biased low input capacitance buffer amplifier according to another preferred embodiment of the present invention.

Turning to FIG. 4, another embodiment is shown for providing another method of biasing the buffer stage 12. The amplifier stage 14 is not shown since it is identical to FIG. 1, above. However, just as with the embodiment of FIG. 1, other amplifiers could be used. In this figure, all of the components which are identical to those of FIG. 1 have the same reference numeral. The only difference in this figure as compared to FIG. 1 is that the gate and drain terminals of the FET 36 are connected to a fixed reference voltage as applied to a resistor $R_8$ from the voltage source $V_{DD}$. The voltage $V_{DD}$ is applied through resistors $R_8$ and $R_9$ to the FET 30.

The advantage of changing the gate terminal connection of the FET 36 in this manner is that the DC bias voltage of the gate terminal of the FET 16 (which is also the voltage across the source-to-substrate of the FET 36) is known. This allows a precise prediction of the total parasitic capacitance at the gate terminal of the FET 16. However, a drawback of this application is that the gate-to-source capacitance of the FET 36 adds to the total parasitic of the input capacitance of the buffer stage 12. The gate-to-source capacitance of the FET 36 in FIG. 1 does not contribute to the total input capacitance, because the gate terminal voltage tends to follow the source terminal voltage.

Figure 5:
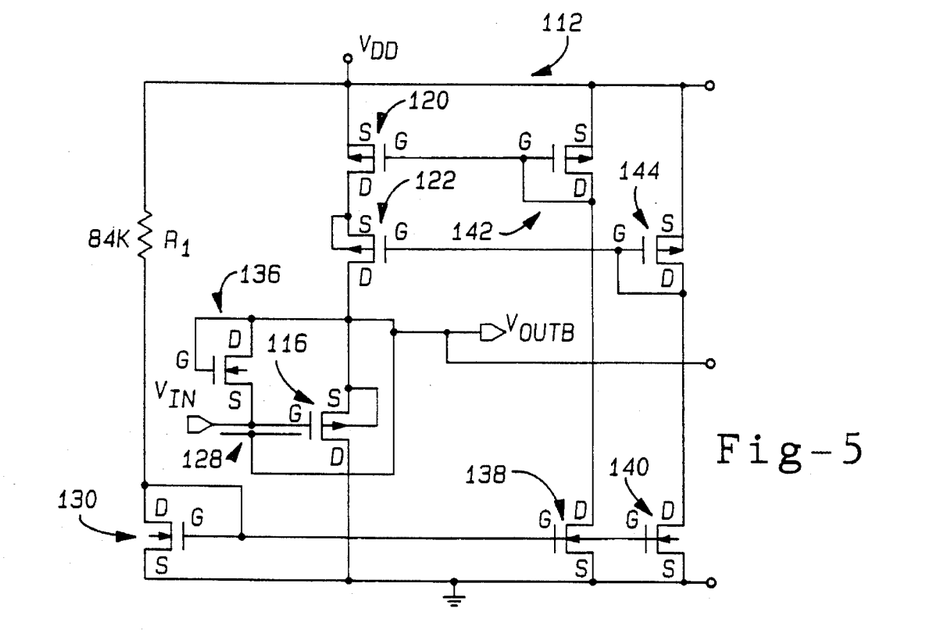
FIG. 5 is a self-biased low input capacitance source follower buffer amplifier according to another preferred embodiment of the present invention.

Now turning to FIG. 5, another embodiment of the present invention is shown in a schematic diagram. This embodiment is proposed for applications in which minimum complexity is necessary. Once again, the amplifying stage 14 is not shown because it is identical to that of FIG. 1 above. In this figure, like components to that of FIGS. 1-4 are represented as being preceded by a "1". The buffer design of FIG. 5 includes all of the advantages of the buffer stage 12 of FIG. 1, with the exception that the gate-to-drain capacitance is not eliminated. This can be realized because each of the FETs 18, 24 and 26 have been eliminated. The same self-biasing features as shown in FIGS. 2, 3 and 4 can be used in the buffer stage 112.

In this embodiment, the drain terminal of the FET 116 is connected to ground. Further, the tail cascoded current source comprised of the FETs 120 and 122 are applied to the source terminal of the FET 116. The output $V_{OUTB}$ is taken from this point. Therefore, for the reasons that the tail cascoded current source of FIG. 1 eliminated the gate-to-source capacitance in the buffer stage 12, the gate-to-source capacitance is also eliminated in the buffer stage 112. The gate-to-substrate capacitance is eliminated in the same manner as described above with reference to FIG. 1.

The FETs 32 and 34 of the buffer stage 12 are also eliminated. Therefore, the self-biasing operation of the buffer stage 112 is somewhat different to that of the buffer stage 12 of FIG. 1. Specifically, when the buffer stage 112 is being powered, the FETs 120 and 122 are operating in their linear region. Since the FET 136 is an N-channel FET, its initial source terminal voltage is at a substrate potential. This causes a large voltage to appear across the gate-to-source junction of the FETs 116 and 136. Therefore, large currents begin to conduct in the FETs 116 and 136 which forces the FETs 120 and 122 to conduct the same current. This in turn increases the source-to-drain terminal voltages of the FETs 120 and 122 such that they begin operating in the saturation region. When the source-to-substrate junction capacitance of the FET 136 is totally charged, the current in the FET 136 becomes zero, the current in the FETs 120 and 122 flows in the FET 116, and the terminal voltages of the buffer stage 112 stabilizes to values dictated by the mirror currents in the FETs 138 and 140.

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

I claim:

1. A buffer for buffering a capacitive output of a sensor, said buffer comprising:

a first field effect transistor (FET) including a gate terminal, a source terminal and a drain terminal, said first FET acting as an input FET wherein an output signal from the sensor is applied to the gate-terminal of the first FET as an input signal;

a second FET including a gate terminal, a source terminal and a drain terminal, said second FET acting as an output FET, wherein the source terminal of the first FET is connected to the source terminal of the second FET, and the gate terminal and the drain terminal of the second FET are connected together;

a third FET including a gate terminal, a source terminal and a drain terminal, wherein the gate terminal of the third FET is connected to the drain terminal of the second FET and the drain terminal of the third FET is connected to a voltage potential; and a fourth FET including a gate terminal, a source terminal and a drain terminal, wherein the source terminal of the third FET is connected to the source terminal of the fourth FET and the gate and drain terminals of the fourth FET are connected to the drain terminal of the first FET, said third and fourth FETs transferring the voltage potential at the gate terminal of the second FET to the drain terminal of the first FET such that the first and second FETs act as a unity gain amplifier.

2. The buffer according to claim 1 further comprising a tail cascoded current source, said tail cascoded current source including a fifth FET and a sixth FET, each of the fifth and sixth FETs including a gate terminal, a source terminal and a drain terminal, wherein the source terminal of the fifth FET is connected to a voltage source, the drain terminal of the fifth FET is connected to the source terminal of the sixth FET, and the drain terminal of the sixth FET is connected to the source terminals of the first and second FETs.

3. The buffer according to claim 2 further comprising seventh, eighth and ninth FETs each including a gate terminal, a source terminal and a drain terminal, wherein the drain and gate terminals of the seventh FET are connected to the voltage source and the gate terminal of the eighth FET, the gate terminal of the eighth FET is connected to the gate terminal of the ninth FET, the drain terminal of the ninth FET is connected to the drain terminal of the second FET, and each of the source terminals of the seventh, eighth and ninth FETs are connected to a ground potential.

4. The buffer according to claim 3 further comprising tenth and eleventh FETs each including a gate terminal, a source terminal and a drain terminal, wherein the gate terminal of the tenth FET is connected to the gate terminal of the ninth FET and the gate terminal of the eleventh FET, the drain terminal of the tenth FET is connected to the gate terminal of the fifth FET, the drain terminal of the eleventh FET is connected to the gate terminal of the sixth FET, and the source terminals of the tenth and eleventh FETs are connected to a ground potential.

5. The buffer according to claim 4 further comprising twelfth and thirteenth FETs each including a gate terminal, a source terminal and a drain terminal, wherein the gate and drain terminals of the twelfth FET are connected to the drain terminal of the tenth FET and the gate terminal of the fifth FET, the gate and drain terminals of the thirteenth FET are connected to the gate terminal of the sixth FET and the drain terminal of the eleventh FET, and the source terminals of the twelfth and thirteenth FETs are connected to the voltage source.

6. The buffer according to claim 1 wherein the drain terminal of the first FET is connected to a substrate shielding layer.

7. The buffer according to claim 6 wherein the substrate shielding layer is a bottom metal layer such that the drain terminal of the first FET is connected to the bottom metal layer.

8. The buffer according to claim 1 further comprising a fifth FET, said fifth FET including a gate terminal, a source terminal and a drain terminal, wherein the source terminal of the fifth FET is connected to the gate terminal of the first FET and the gate and drain terminals of the fifth FET are connected to the source terminal of the first FET.

9. The buffer according to claim 1 further comprising fifth, sixth, seventh, eighth and ninth FETs each including a gate terminal, a source terminal, and a drain terminal, wherein the gate and drain terminals of the fifth FET are connected to the gate terminal of the first FET, the gate and drain terminals of the sixth FET are connected to the source terminal of the fifth FET and the drain terminal of the seventh FET, the source terminal of the sixth FET is connected to the source terminal of the eighth FET and the drain terminal of the ninth FET, the source terminal of the seventh FET is connected to a voltage source, the drain terminal of the eighth FET is connected to the voltage source, the gate terminal of the eighth FET is connected to the source terminals of the first and second FETs, the gate terminal of the ninth FET is connected to the voltage source, and the source terminal of the ninth FET is connected to a ground potential.

10. The buffer according to claim 1 further comprising fifth, sixth, seventh, eighth and ninth FETs each including a gate terminal, a source terminal and a drain terminal, wherein the source of the fifth FET is connected to the source terminal of the first FET, the source terminal of the sixth FET is connected to the drain and gate terminals of the fifth FET and the drain terminal of the ninth FET, the gate and drain terminals of the sixth FET are connected to the gate terminal of the seventh FET and the drain terminal of the eighth FET, the source terminal of the seventh FET is connected to the gate terminal of the first FET, the drain terminal of the seventh FET is connected to a voltage source, the source terminal of the eighth FET is connected to the voltage source, the gate terminal of the ninth FET is connected to the voltage source, and the source terminal of the ninth FET is connected to a ground potential.

11. A buffer according to claim 1 further comprising a fifth FET, said fifth FET including a gate terminal, a source terminal and a drain terminal, wherein the source terminal of the fifth FET is connected to the gate terminal of the first FET and the gate and drain terminals of the fifth FET are connected to a voltage source.

12. A buffer for buffering a capacitive output of a sensor, said buffer comprising:

a first field effect transistor (FET) including a gate terminal, a source terminal and a drain terminal, said first FET acting as an input FET wherein an output signal from the sensor is applied to the gate terminal of the first FET as an input signal;

a second FET including a gate terminal, a source terminal and a drain terminal, said second FET being a biasing FET that biases the gate terminal of the first FET, wherein the gate terminal of the first FET is connected to a terminal selected from the group of terminals consisting of the drain terminal of the second FET and the source terminal of the second FET; and a tail cascoded current source, said tail cascoded current source including a third FET and a fourth FET each including a at least, a source terminal and a drain terminal, wherein the source terminal of the third FET is connected to a voltage potential, the drain terminal of the third FET is connected to the source terminal of the fourth FET, and the drain terminal of the fourth FET is connected to the source terminal of the first FET.

13. The buffer according to claim 12 wherein the drain and gate terminals of the second FET are connected to a voltage source.

14. The buffer according to claim 12 further comprising fifth and sixth FETs each including a gate terminal, a source terminal and a drain terminal, wherein the gate and drain terminals of the second FET are connected to the gate terminal of the first FET, the source terminal of the second FET is connected to the gate and drain terminals of the fifth FET, the source terminal of the fifth FET is connected to the source terminal of the sixth FET, the gate terminal of the sixth FET is connected to the source terminal of the first FET, and the drain terminal of the sixth FET is connected to a voltage source.

15. The buffer according to claim 12 wherein the drain and gate terminals of the second FET are connected to the drain terminal of the fourth FET.

16. The buffer according to claim 12 further comprising a fifth FET including a gate terminal, a source terminal and a drain terminal, wherein the source terminal of the second FET is connected to the gate terminal of the first FET, the gate and drain terminals of the second FET are connected to the source terminal of the first FET, the source terminal of the fifth FET is connected to the source terminal of the first FET, and the gate terminal and the drain terminal of the fifth FET are connected such that the first and fifth FETs act as a unity gain amplifier so that an output signal at the gate terminal of the fifth FET substantially coincides with the input signal applied at the gate terminal of the first FET.

17. The buffer according to claim 16 further comprising a sixth and a seventh FET each including a gate terminal, a source terminal and a drain terminal, wherein the gate terminal of the sixth FET is connected to the drain terminal of the fifth FET, the drain terminal of the sixth FET is connected to a voltage source, the source terminal of the sixth FET is connected to the source terminal of the seventh FET, and the gate and drain terminals of the seventh FET are connected to the drain terminal of the first FET.

18. The buffer according to claim 16 further comprising sixth, seventh and eighth FETs each including a gate terminal, a source terminal and a drain terminal, wherein the drain and gate terminals of the sixth FET are connected to the voltage source and the gate terminal of the seventh FET, the drain terminal of the seventh FET is connected to the drain terminal of the first FET, the gate terminal of the seventh FET is connected to the gate terminal of the eighth FET, the drain terminal of the eighth FET is connected to the drain terminal of the fifth FET, and each of the source terminals of the sixth, seventh, and eighth FETs are connected to a ground potential.

19. The buffer according to claim 18 further comprising ninth and tenth FETs each including a gate terminal, a source terminal and a drain terminal, wherein the gate terminal of the ninth FET is connected to the gate terminal of the eighth FET and the gate terminal of the tenth FET, the drain terminal of the ninth FET is connected to the gate terminal of the third FET, the drain terminal of the tenth FET is connected to the gate terminal of the fourth FET, and the source terminals of the ninth and tenth FETs are connected to the ground potential.

20. The buffer according to claim 19 further comprising eleventh and twelfth FETs each including a gate terminal, a source terminal and a drain terminal, wherein the gate and drain terminals of the eleventh FET are connected to the drain terminal of the ninth FET and the gate terminal of the third FET, the gate and-drain terminals of the twelfth FET are connected to the gate terminal of the fourth FET and the drain terminal of the tenth FET, and the source terminals of the eleventh and twelfth FET are connected to the voltage source.

21. The buffer according to claim 12 wherein the drain terminal of the first FET is connected to a substrate shielding layer.

22. The buffer according to claim 21 wherein the substrate shielding layer is a bottom metal layer of the first FET.

23. A buffer amplifier for buffering and amplifying a capacitive output of a sensor, said buffer amplifier comprising:

a first field effect transistor (FET) including a gate terminal, a source terminal and a drain terminal, said first FET acting as an input FET wherein an output signal from the sensor is applied to the gate terminal of the first FET as an input signal, said drain terminal of the first FET being connected to a shielding layer;

a second FET including a gate terminal, a source terminal and a drain terminal, wherein the source terminal of the second FET is connected to the source terminal of the first FET, and the gate terminal and the drain terminal of the second FET are connected such that the first and second FETs act as a unity gain amplifier so that a signal at the gate-terminal of the second FET substantially coincides with the input signal applied at the gate terminal of the first FET;

a tail cascoded current source, said tail cascoded current source including a third FET and a fourth FET each including a gate terminal, a source terminal and a drain terminal, wherein the source terminal of the third FET is connected to a voltage source, the drain terminal of the third FET is connected to the source terminal of the fourth FET and the drain terminal of the fourth FET is connected to the source terminals of the first and second FETs;

a fifth FET including a gate terminal, a source terminal and a drain terminal, wherein the gate terminal of the fifth FET is connected to the drain terminal of the second FET, and the drain terminal of the fifth FET is connected to the voltage source;

a sixth FET including a gate terminal, a source terminal and a drain terminal, wherein the source terminal of the sixth FET is connected to the source terminal of the fifth FET, and the gate and drain terminals of the sixth FET are connected to the drain terminal of the first FET;

a seventh FET including a gate terminal, a source terminal and a drain terminal, wherein the gate terminal of the seventh FET is connected to one of the group consisting of the gate terminal Of the first FET, the source terminal of the first FET and a voltage source;

an eighth FET including a gate terminal, a source terminal and a drain terminal, wherein the drain and gate terminals of the eighth FET are connected to the voltage source and the source terminal of the eighth FET is connected to a ground potential;

a ninth FET including a gate terminal, a source terminal and a drain terminal, wherein the gate terminal of the ninth FET is connected to the gate terminal of the eighth FET, the drain terminal of the ninth FET is connected to the source terminals of the fifth and sixth FETs, and the source terminal of the ninth FET is connected to a ground potential;

a tenth FET including a gate terminal, a source terminal and a drain terminal, wherein the gate terminal of the tenth FET is connected to the gate terminal of the ninth FET, the drain terminal of the tenth FET is connected to the drain terminal of the second FET, and the source terminal of the tenth FET is connected to a ground potential; and an amplifier circuit, said amplifier circuit receiving the output signal from the gate terminal of the second FET and providing an amplified output signal.

24. The buffer amplifier according to claim 23 wherein the gate terminal and the drain terminal of the seventh FET are connected to the voltage source.

25. The buffer amplifier according to claim 23 further comprising eleventh, twelfth, thirteenth and fourteenth FETs each including a gate terminal, a source terminal, and a drain terminal, wherein the gate and drain terminals of the seventh FET are connected to the gate terminal of the first FET, the gate and drain terminals of the eleventh FET are connected to the source terminal of the seventh FET and the drain terminal of the twelfth FET, the source terminal of the eleventh FET is connected to the source terminal of the thirteenth FET and the drain terminal of the fourteenth FET, the source terminal of the twelfth FET is connected to the voltage source, the drain terminal of the thirteenth FET is connected to the voltage source, the gate terminal of the thirteenth FET is connected to the source terminals of the first and second FETs, the gate terminal of the fourteenth FET is connected to the voltage source, and the source terminal of the fourteenth FET is connected to a ground potential.

26. The buffer amplifier according to claim 23 further comprising eleventh, twelfth, thirteenth and fourteenth FETs each including a gate terminal, a source terminal and a drain terminal, wherein the source terminal and the gate terminal Of the seventh FET are connected to the source terminal of the first FET, the source terminal of the eleventh FET is connected to the drain terminal of the seventh FET and the drain terminal of the fourteenth FET, the gate and drain terminals of the eleventh FET are connected to the gate terminal of the twelfth FET and the drain terminal of the thirteenth FET, the source terminal of the twelfth FET is connected to the gate terminal of the first FET, the drain terminal of the twelfth FET is connected to the voltage source, the source terminal of the thirteenth FET is connected to the voltage source, the gate terminal of the fourteenth FET is connected to the voltage source, and the source terminal of the fourteenth FET is connected to a ground potential.

27. The buffer amplifier according to claim 23 further comprising eleventh and twelfth FETs each including a gate terminal, a source terminal and a drain terminal, wherein the source terminal of the seventh FET is connected to the gate terminal of the first FET, the gate and drain terminals of the seventh FET are connected to the source terminal of the first FET, the gate terminal of the eleventh FET is connected to the gate terminal of the tenth FET and the gate terminal of the twelfth. FET, the drain terminal of the eleventh FET is connected to the gate terminal of the third FET, the drain terminal of the twelfth FET is connected to the gate terminal of the fourth FET, and the source terminals of the eleventh and twelfth FETs are connected to a ground potential.

28. The buffer amplifier according to claim 27 further comprising thirteenth and fourteenth FETs each including a gate terminal, a source terminal and a drain terminal, wherein the gate and drain terminals of the thirteenth FET is connected to the drain terminal of the eleventh FET and the gate terminal of the third FET, the gate and drain terminals of the fourteenth FET are connected to the gate terminal of the fourth FET and the drain terminal of the twelfth FET, and the source terminals of the thirteenth and fourteenth FETs are connected to the voltage source.

29. The buffer amplifier according to claim 23 wherein the substrate shielding layer is a bottom layer of the first FET.

30. A buffer for buffering a capacitive output of a sensor, said buffer comprising:

a first field effect transistor (FET) including a gate terminal, a source terminal and a drain terminal, said first FET acting as an input FET wherein an output signal from the sensor is applied to the gate terminal of the first FET as an input signal;

a second FET including a gate terminal, a source terminal and a drain terminal, said second FET being a biasing FET that biases the first FET, wherein the gate terminal of the second FET is connected to the source terminal of the first FET; and a tail cascoded current source including a third FET and a fourth FET each including a gate terminal, a source terminal and a drain terminal, wherein the source terminal of the third FET is connected to a voltage potential, the drain terminal of the third FET is connected to the source terminal of the fourth FET, and the drain terminal of the fourth FET is connected to the source terminal of the first FET.

31. The buffer according to claim 30 further comprising fifth and sixth FETs each including a gate terminal, a source terminal and a drain terminal, wherein the source terminal of the second FET is connected to the source terminal of the first FET, the drain and gate terminals of the second FET are connected to the source terminal of the fifth FET, the gate and drain terminals of the fifth FET are connected to the gate terminal of the sixth FET, the source terminal of the sixth FET is connected to the gate terminal of the first FET, and the drain terminal of the sixth FET is connected to a voltage source.

32. The buffer according to claim 31 further comprising seventh and eighth FETs each including a gate terminal, a source terminal and a drain terminal, wherein the drain terminal of the seventh FET is connected to the gate and drain terminals of the fifth FET, the source terminal of the seventh FET is connected to the voltage source, the drain terminal of the eighth FET is connected to the drain terminal of the second FET and the source terminal of the fifth FET, the gate terminal of the eighth FET is connected to the voltage source, and the source terminal of the eighth FET is connected to a ground potential.

33. A buffer for buffering a capacitive output of a sensor, said buffer comprising:

a first field effect transistor (FET) including a gate terminal, a source terminal and a drain terminal, said first FET acting as an input FET wherein an output signal from the sensor is applied to the gate terminal of the first FET as an input signal;

a second FET including a gate terminal, a source terminal and a drain terminal, said second FET being a biasing FET that biases the gate terminal of the first FET, wherein the gate terminal of the first FET is connected to a terminal selected from the group of terminals consisting of the drain terminal of the second FET and the source terminal of the second FET; and a third and a fourth FET each including a gate terminal, a source terminal and a drain terminal, wherein the gate and drain terminals of the second FET are connected to the gate terminal of the first FET, the source terminal of the second FET is connected to the gate and drain terminals of the third FET, the source terminal of the third FET is connected to the source terminal of the fourth FET, the gate terminal of the fourth FET is connected to the source terminal of the first FET, and the drain terminal of the fourth FET is connected to a voltage source.

34. The buffer according to claim 33 further comprising fifth and sixth FETs each including a gate terminal, a source terminal, and a drain terminal, wherein the drain terminal of the fifth FET is connected to the gate and drain terminals of the third FET, the source terminal of the fifth FET is connected to the voltage source, the drain terminal of the sixth FET is connected to the source terminals of the third and fourth FETs, the gate terminal of the sixth FET is connected to the voltage source, and the source terminal of the sixth FET is connected to a ground potential.

35. A buffer for buffering a capacitive output of a sensor, said buffer comprising:

a first field effect transistor (FET) including a gate terminal, a source terminal and a drain terminal, said first FET acting as an input FET wherein an output signal from the sensor is applied to the gate terminal of the first FET as an input signal;

a second FET including a gate terminal, a source terminal and a drain terminal, said second FET being a biasing FET that biases the gate terminal of the first FET, wherein the source terminal of the second FET is connected to the source terminal of the first FET; and a third FET and a fourth FET each including a gate terminal, a source terminal and a drain terminal, wherein the source terminal of the second FET is connected to the source terminal of the first FET, the drain and gate terminals of the second FET are connected to the source terminal of the third FET, the gate and drain terminals of the third FET are connected to the gate terminal of the fourth FET, the source terminal of the fourth FET is connected to the gate terminal of the first FET, and the drain terminal of the fourth FET is connected to a voltage source.

* * * * *